United States Patent
Hawk

(10) Patent No.: US 8,368,574 B1
(45) Date of Patent: Feb. 5, 2013

(54) DYNAMIC RANGE ADC'S

(75) Inventor: Douglas Hawk, Mission Viejo, CA (US)

(73) Assignee: Omniphase Research Laboroatories, Inc., Newport Beach, CA (US)

( * ) Notice: Subject to any disclaimer, the term of this patent is extended or adjusted under 35 U.S.C. 154(b) by 58 days.

(21) Appl. No.: 13/094,618

(22) Filed: Apr. 26, 2011

Related U.S. Application Data

(60) Provisional application No. 61/328,167, filed on Apr. 26, 2010.

(51) Int. Cl.
*H03M 1/12* (2006.01)

(52) U.S. Cl. .......................... 341/156; 341/155

(58) Field of Classification Search .................. 341/143, 341/155, 156
See application file for complete search history.

(56) References Cited

U.S. PATENT DOCUMENTS 8,188,901 B1 * 5/2012 Inamdar et al. ............... 341/156

* cited by examiner

*Primary Examiner* — Khai M Nguyen
(74) *Attorney, Agent, or Firm* — The Eclipse Group LLP

(57) ABSTRACT

A Sigma-Delta analog-to-digital converter (ADC) having a direct time filter (DTF) in the feed-back path of the Sigma-Delta loop of the ADC. A Sigma-Delta ADC having a modified DTF in the feed-back path of the Sigma-Delta loop of the ADC is also disclosed. The ADC may also include a noise reduction block that splits an incoming RF signal, samples one of the split signals with a primary ADC, corrects for gain and delay inaccuracies and inverts the signal, applies the inverted signal to a primary digital-to-analog converter (DAC), combines the output of the DAC with the second split signal, which is then applied to a difference ADC.

5 Claims, 10 Drawing Sheets

DYNAMIC RANGE ADC'S

RELATED APPLICATIONS

This application claims priority under 35 U.S.C. Section 119(e) to U.S. Provisional Patent Application Ser. No. 61/328,167, filed on Apr. 26, 2010, entitled "DYNAMIC RANGE ADCs", which application in its entirety is incorporated by reference in this application.

BACKGROUND

1. Field of the Invention

The invention relates to an analog-to-digital converter and more particularly to a Sigma-Delta analog-to-digital converter having a continuous time filter and/or a discrete time filter and a noise reduction block.

2. Related Art

At present, virtually all communications, radar, EW, cell phone, wireless data, and radio systems today require the function of analog-to-digital conversion, so that the tremendous power afforded by modern digital processing can be taken advantage of fully. As Walden noted in his study in 1999, technological progress as measured by the product of the analog-to-digital conversion resolution (bits) times the sampling rate has been slow over the last decade, especially when compared with the large improvements recently made in the area of Digital Signal Processing (DSP) and Software-Defined Radio (SDR). New developments in multi-format and wideband military and commercial communications systems require a high dynamic range and flexible digitizing system, where the output center frequency and bandwidth can be selected arbitrarily over a very wide range, while minimizing cost and complexity by utilizing a single common RF front end.

Numerous factors, such as thermal noise and clock jitter, may degrade the ideal performance of an analog-to-digital converter (ADC) resulting in a lower signal-to-noise-ratio (SNR) value and higher effective noise figure value. Because of the need to improve the performance of the ADC relative to the improved capabilities of DSP and SDR, various techniques have been tested, where one of the measurements of improved performance is the SNR. The gain of a Sigma-Delta loop in the ADC can be increased to produce subsequent gains in the SNR, but there is, of course, a limit to the amount of gain that can be applied while still maintaining loop stability. Thus, there is a need for an improved ADC to match the large improvements recently made in the area of DSP and SDR using other techniques.

SUMMARY

A Sigma-Delta analog-to-digital converter (ADC) having a Sigma-Delta ADC loop with a feed-forward path and a feed-back path is disclosed, where the Sigma-Delta ADC may include a continuous time filter (CTF) in the feed-forward path of the Sigma-Delta loop of the ADC. In another implementation, the Sigma-Delta ADC may include a discrete-time filter (DTF) in the feed-back path of the Sigma-Delta loop of the ADC, and in yet another implementation, the DTF in the feed-back path may be a modified DTF.

Also disclosed is an ADC noise reduction block comprising a radio frequency (RF) splitter, a primary ADC, a primary digital-to-analog (DAC), an RF combiner, a Difference ADC, and a field programmable gate array (FPGA) that includes an inverter and an adder. A method of operating of the ADC noise reduction block is also disclosed.

It is to be understood that the features mentioned above and those yet to be explained below can be used not only in the respective combinations indicated, but also in other combinations or in isolation, without leaving the scope of the present invention.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The description below may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
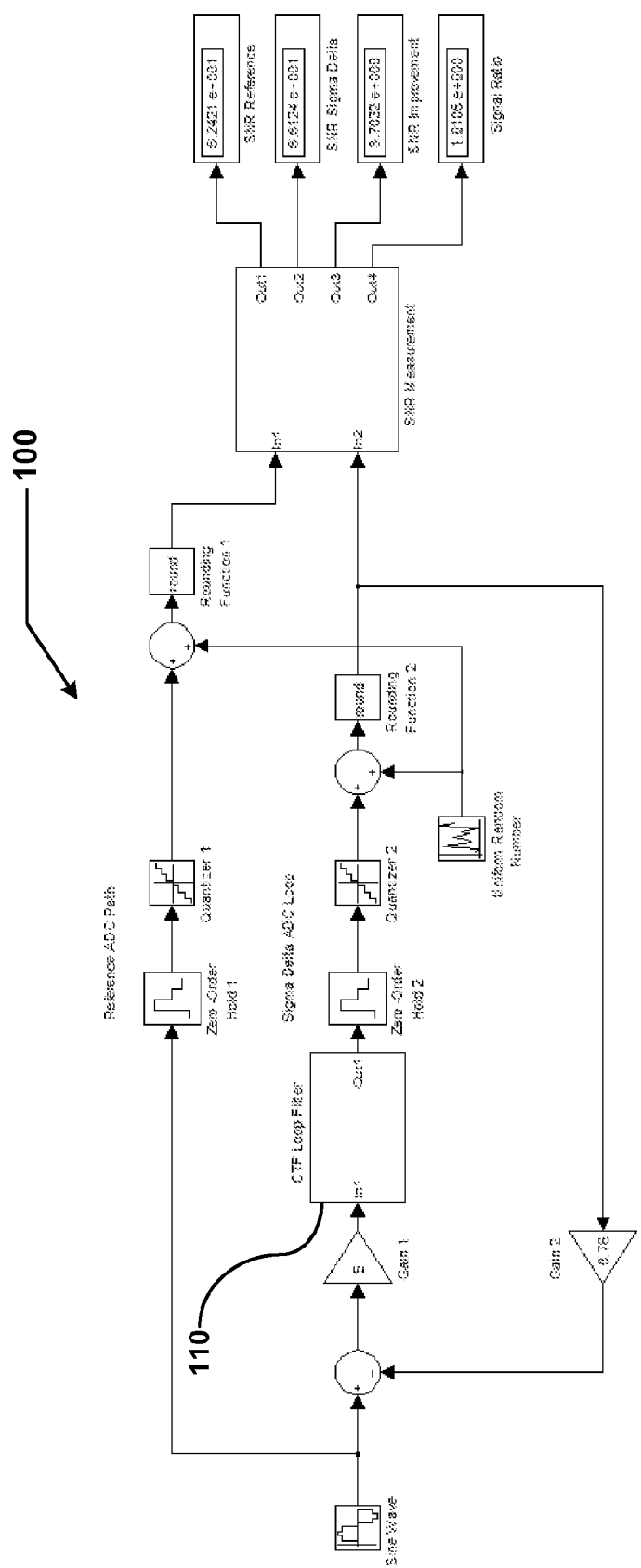
FIG. 1 shows a schematic block diagram of an example of a Sigma-Delta analog-to-digital converter (ADC) having a continuous time filter (CTF) in the feed-forward path of the Sigma-Delta loop of the ADC.

FIG. 1 shows a schematic block diagram of an example of a Sigma-Delta analog-to-digital converter (ADC) having a continuous time filter (CTF) in the feed-forward path of the Sigma-Delta loop of the ADC. In FIG. 1, the Sigma-Delta ADC 100 includes a Sigma-Delta ADC Loop 102 having a CTF Loop Filter 110 in the feed-forward path of the Sigma-Delta ADC Loop 102.

Figure 2A:
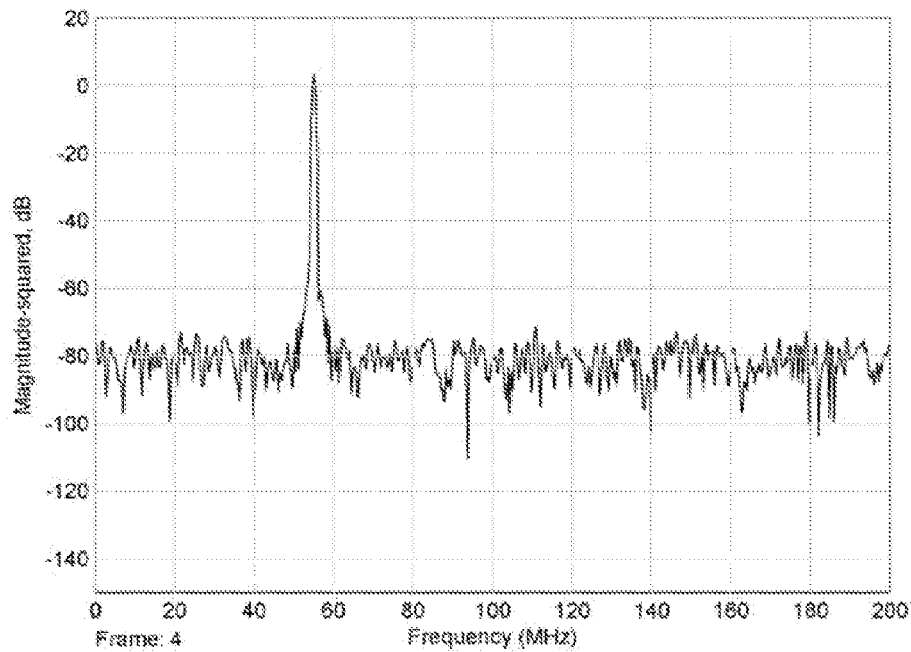
FIGS. 2A and 2B show a graph of the performance results of a test of a Sigma-Delta ADC using a source frequency of 55 MHz and a graph of the performance results of a test of the ADC of FIG. 1 using a source frequency of 55 MHz, respectively.

FIG. 2A shows a graph of the performance results of a test of a Sigma-Delta ADC using a source frequency of 55 MHz, where the Sigma-Delta ADC includes a Discrete Time Filter (DTF) in the feed-forward path of the Sigma-Delta loop of the Sigma-Delta ADC. The graph of FIG. 2A is a reference spectrum for a comparison of the performance results shown in FIG. 2B, and the graph of FIG. 2A is shown again as FIGS. 4A, 7A, and 9A for comparison with FIGS. 4B, 7B, and 9B, respectively.

Figure 2B:
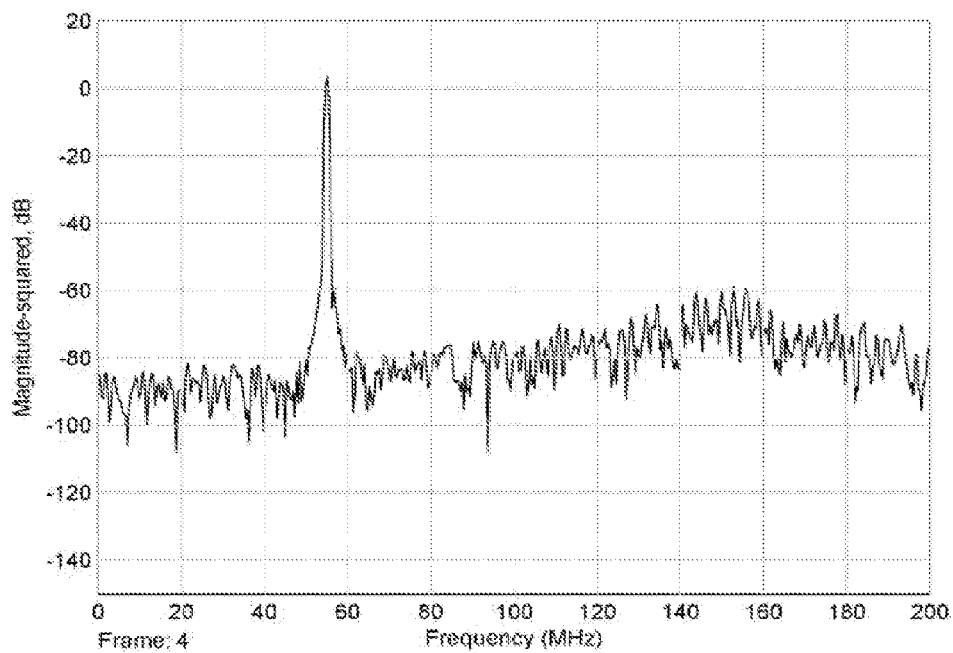

Turning to FIG. 2B, this shows a graph of the performance results of a test of the Sigma-Delta ADC of FIG. 1 using a source frequency of 55 MHz, where the Sigma-Delta ADC 100 has a CTF Loop Filter 110 in the feed-forward path of the Sigma-Delta ADC Loop 102 replacing a DTF. Comparison of FIGS. 2A and 2B shows a 3.7 dB SNR improvement with the Sigma-Delta ADC of FIG. 1 over the reference spectrum of FIG. 2A.

Figure 3:
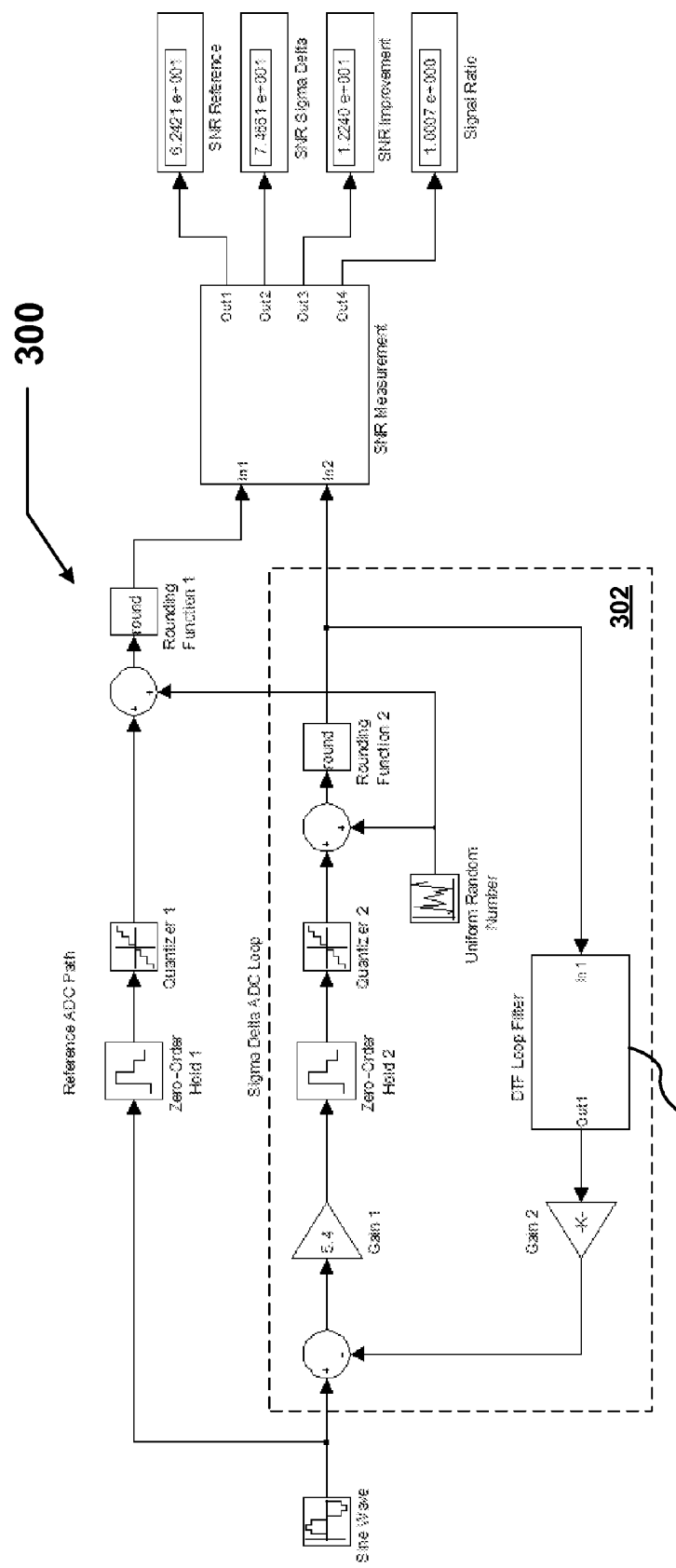
FIG. 3 shows a schematic block diagram of an example of a Sigma-Delta ADC having a discrete-time filter (DTF) in the feed-back path of the Sigma-Delta loop of the ADC.

FIG. 3 shows a schematic block diagram of an example of a Sigma-Delta ADC having a DTF in the feed-back path of the Sigma-Delta loop of the Sigma-Delta ADC. In FIG. 3, the Sigma-Delta ADC 300 includes a Sigma-Delta ADC Loop 302 having a DTF Loop Filter 310 in the feed-back path of the Sigma-Delta ADC Loop 302.

Figure 4A:
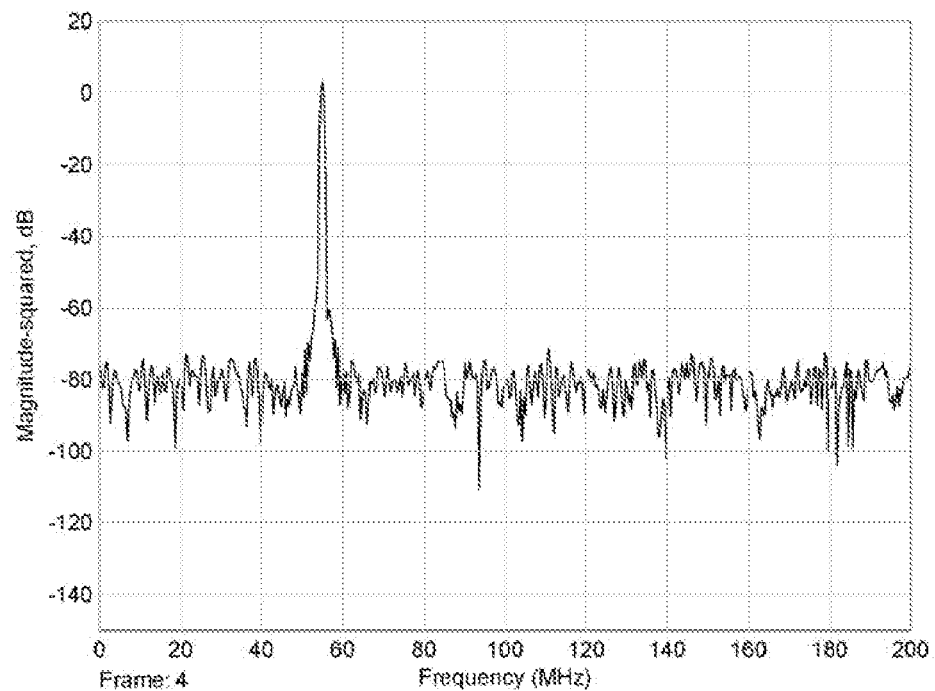
FIGS. 4A and 4B show a graph of the performance results of a test of a Sigma-Delta ADC using a source frequency of 55 MHz (which is the same as FIG. 2A) and a graph of the performance results of a test of the ADC of FIG. 3 using a source frequency of 55 MHz, respectively.
Figure 4B:
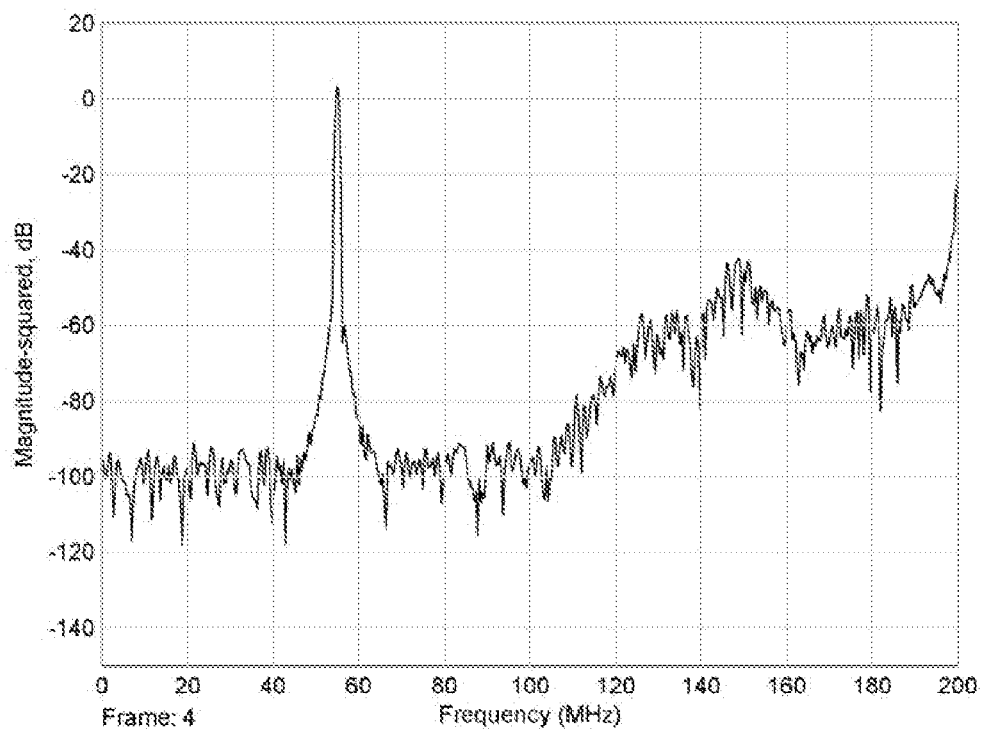

FIG. 4A shows a graph of the performance results of a test of a Sigma-Delta ADC using a source frequency of 55 MHz, where the Sigma-Delta ADC includes a Discrete Time Filter (DTF) in the feed-forward path of the Sigma-Delta loop of the Sigma-Delta ADC. FIG. 4B shows a graph of the performance results of a test of the Sigma-Delta ADC of FIG. 3 using a source frequency of 55 MHz, where the Sigma-Delta ADC 300 has a CTF Loop Filter 310 in the feed-back path of the Sigma-Delta ADC Loop 302. Comparison of FIGS. 4A and 4B shows a 12.24 dB SNR improvement with the Sigma-Delta ADC of FIG. 3 over the reference spectrum of FIG. 4A.

Figure 5:
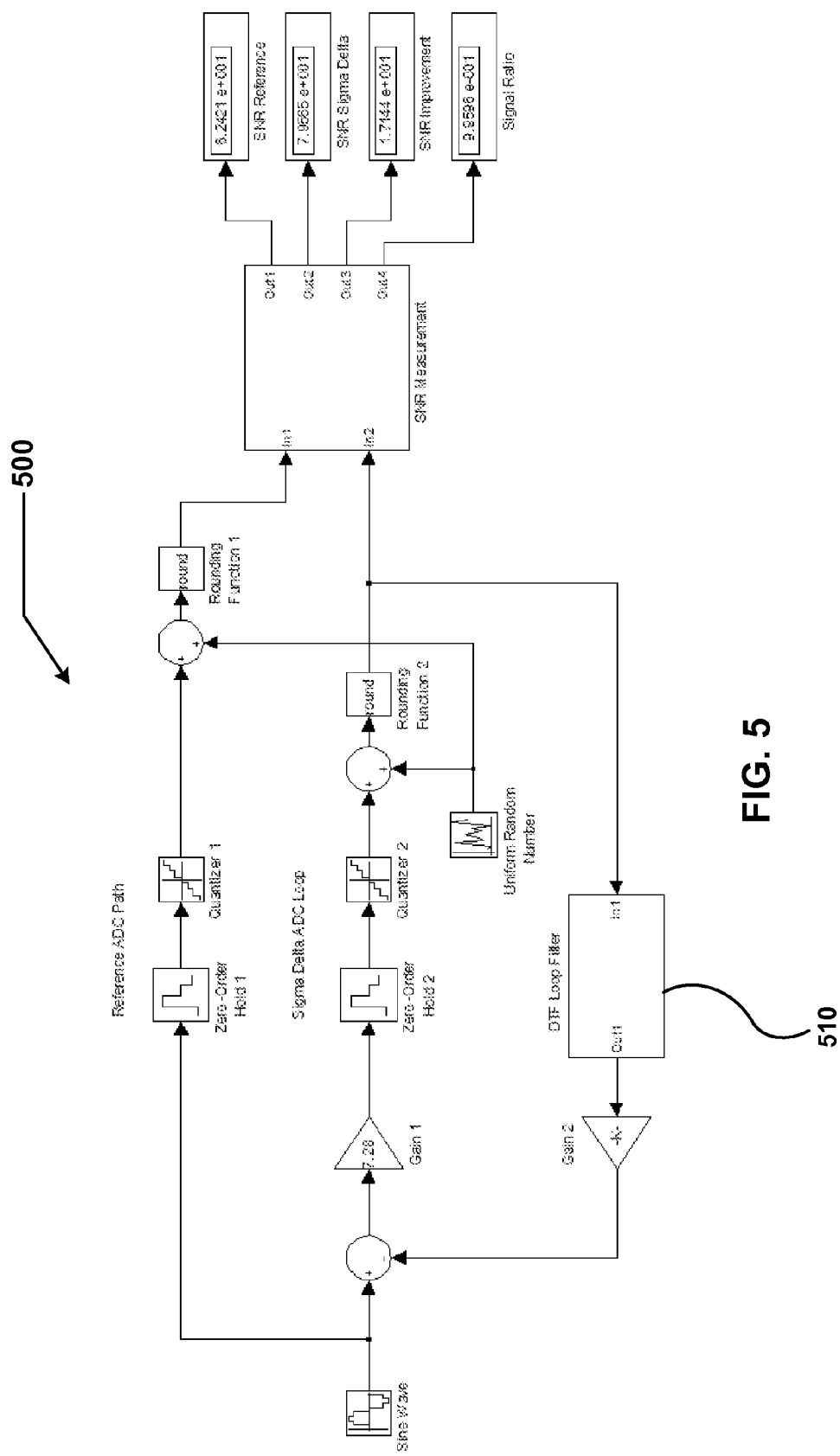
FIG. 5 shows a schematic block diagram of an example of a Sigma-Delta ADC having a modified discrete-time filter (DTF) in the feed-back path of the Sigma-Delta loop of the ADC.
Figure 6:
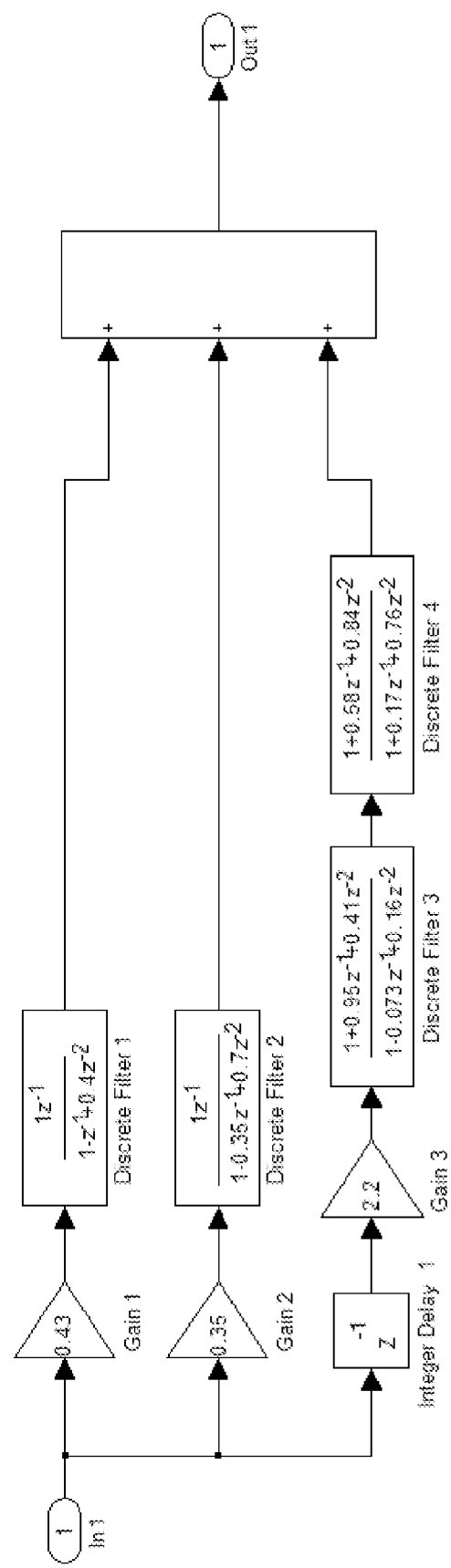
FIG. 6 shows a schematic block diagram of an example of the modified DTF of FIG. 5.

FIG. 5 shows a schematic block diagram of an example of a Sigma-Delta ADC having a modified DTF in the feed-back path of the Sigma-Delta loop of the Sigma-Delta ADC. In FIG. 5, the Sigma-Delta ADC 500 includes a Sigma-Delta ADC Loop 502 having a modified DTF Loop Filter 310 in the feed-back path of the Sigma-Delta ADC Loop 302. FIG. 6 shows a schematic block diagram of an example implementation of the modified DTF of FIG. 5.

Figure 7A:
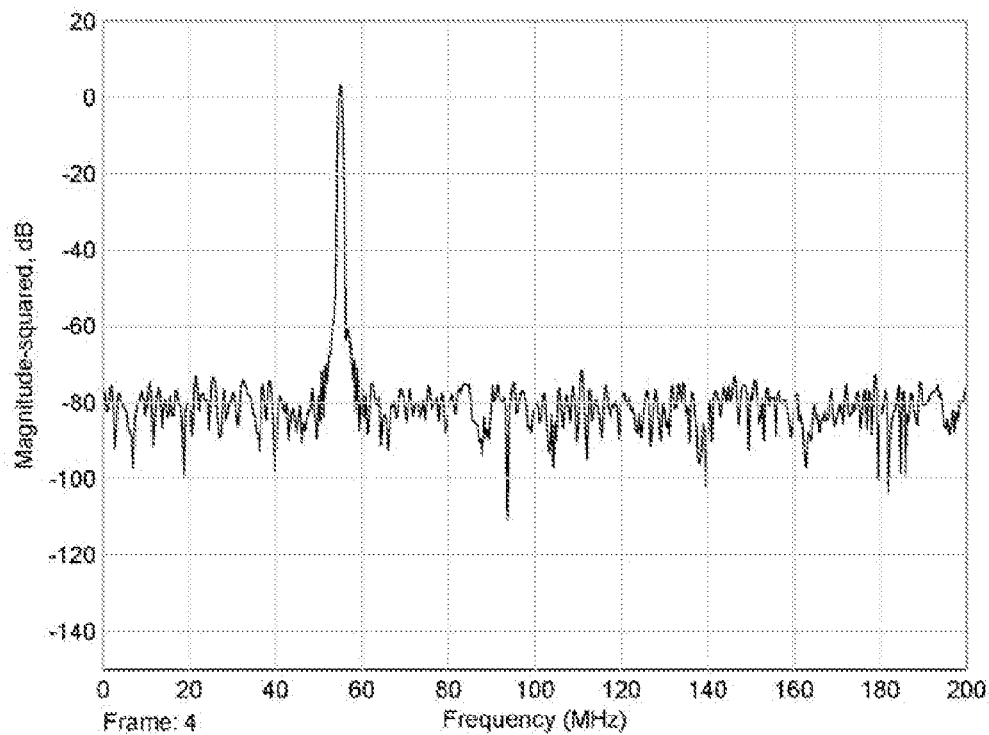
FIGS. 7A and 7B show a graph of the performance results of a test of a Sigma-Delta ADC using a source frequency of 55 MHz (which is the same as FIG. 2A) and a graph of the performance results of a test of the ADC of FIG. 5 using a source frequency of 55 MHz, respectively.
Figure 7B:
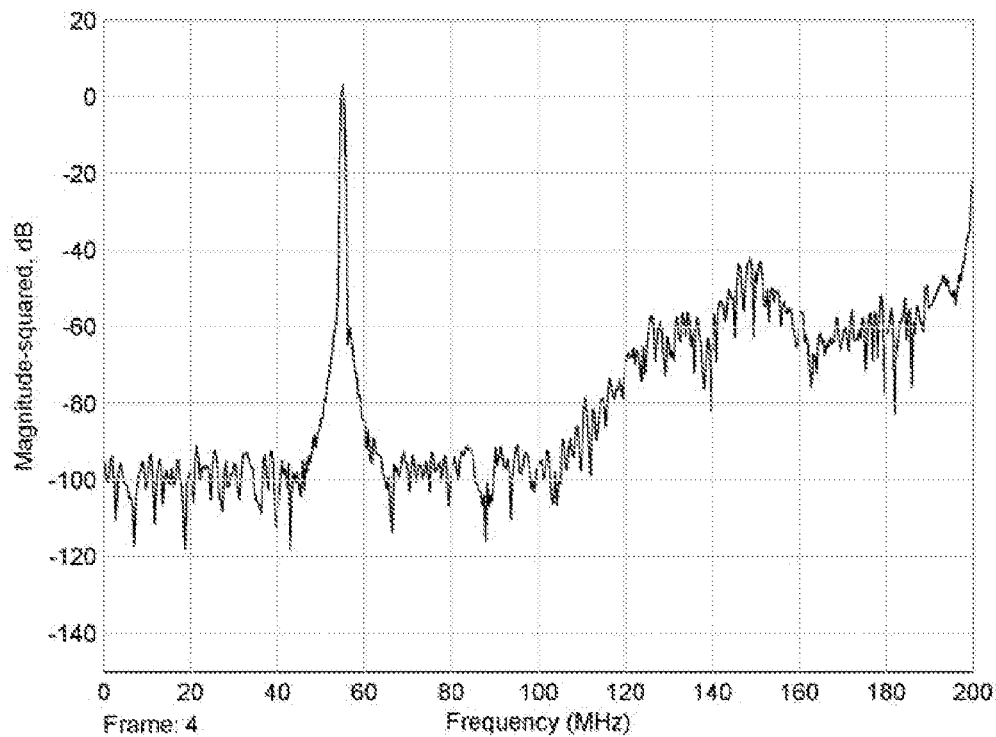

FIG. 7A shows a graph of the performance results of a test of a Sigma-Delta ADC using a source frequency of 55 MHz, where the Sigma-Delta ADC includes a Discrete Time Filter (DTF) in the feed-forward path of the Sigma-Delta loop of the Sigma-Delta ADC. FIG. 7B shows a graph of the performance results of a test of the Sigma-Delta ADC of FIG. 5 using a source frequency of 55 MHz, where the Sigma-Delta ADC 500 has a modified DTF Loop Filter 510 in the feed-back path of the Sigma-Delta ADC Loop 502. Comparison of FIGS. 7A and 7B shows a 17.14 dB SNR improvement with the Sigma-Delta ADC of FIG. 5 over the reference spectrum of FIG. 7A.

Figure 8:
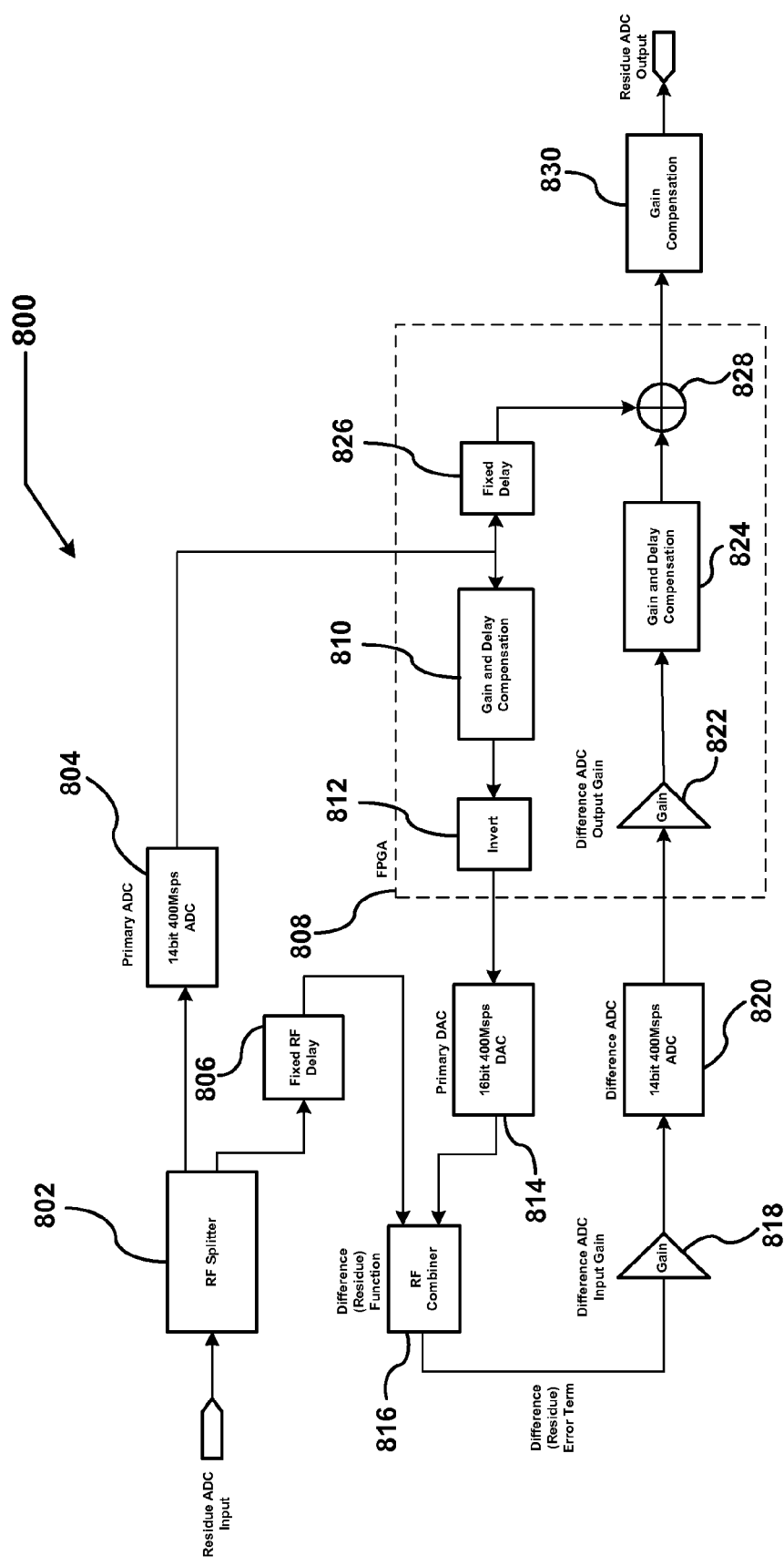
FIG. 8 shows a schematic block diagram of an example of an ADC noise reduction block that may be included in the ADCs of FIGS. 1, 3, and 5.

FIG. 8 shows a schematic block diagram of an example of an ADC noise reduction block that may be included in the ADCs of FIGS. 1, 3, and 5. The ADC noise reduction block 800 includes a radio frequency (RF) splitter 802 that splits an incoming analog signal into two signals, where one of the split signals is applied to Primary ADC 804 and other is applied to Fixed RF Delay block 806. From Primary ADC 804, the first signal is applied to field programmable gate array (FPGA) 808. The FPGA 808 includes a Gain and Delay Compensation block 810 and an Inverter 812. The output from the Inverter 812 is applied to primary digital-to-analog converter (DAC) 814.

The output from primary DAC 814 is combined with the output from Fixed RF Delay block 806 in RF Combiner 816, and the output from RF Combiner 816 is applied to Difference ADC Input Gain 818, and the output from Difference ADC Input Gain 818 is then applied to Difference ADC 820. In turn, the output from Difference ADC 820 is applied to Difference ADC Output Gain 822 and then Gain and Compensation block 824. The output from Gain and Compensation block 824 is applied to Adder 828, which also receives the output from Primary ADC 804 after passing through Fixed Delay block 826. The output from Adder 828 is then sent to Gain Compensation block 830.

Figure 9A:
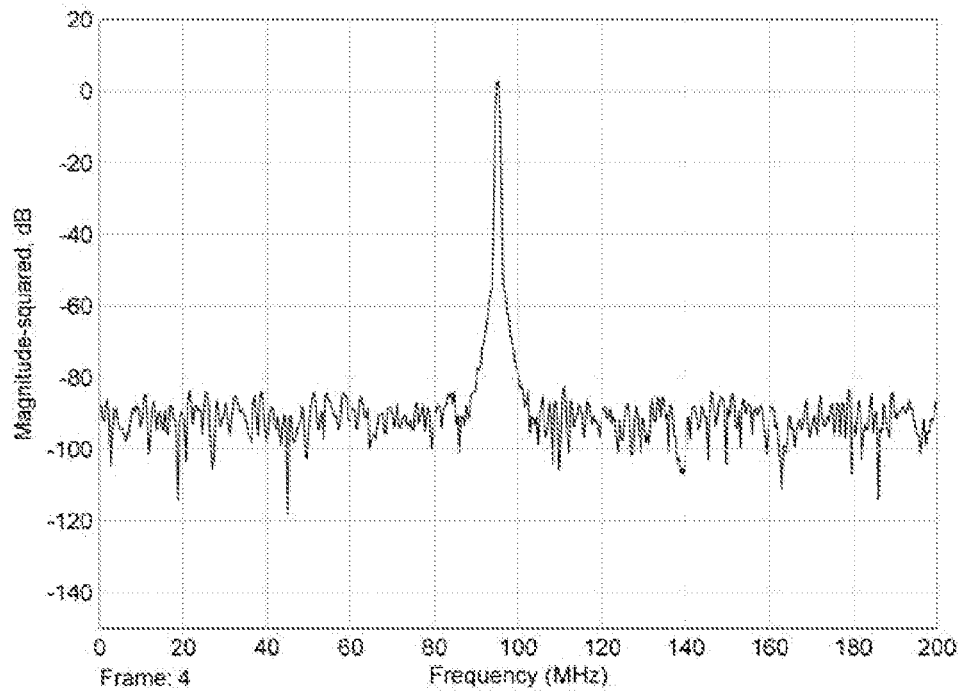
FIGS. 9A and 9B show a graph of the performance results of a test of a Sigma-Delta ADC using a source frequency of 95 MHz and a graph of the performance results of a test of an ADC having the ADC noise reduction block of FIG. 8 using a source frequency of 95 MHz, respectively.
Figure 9B:
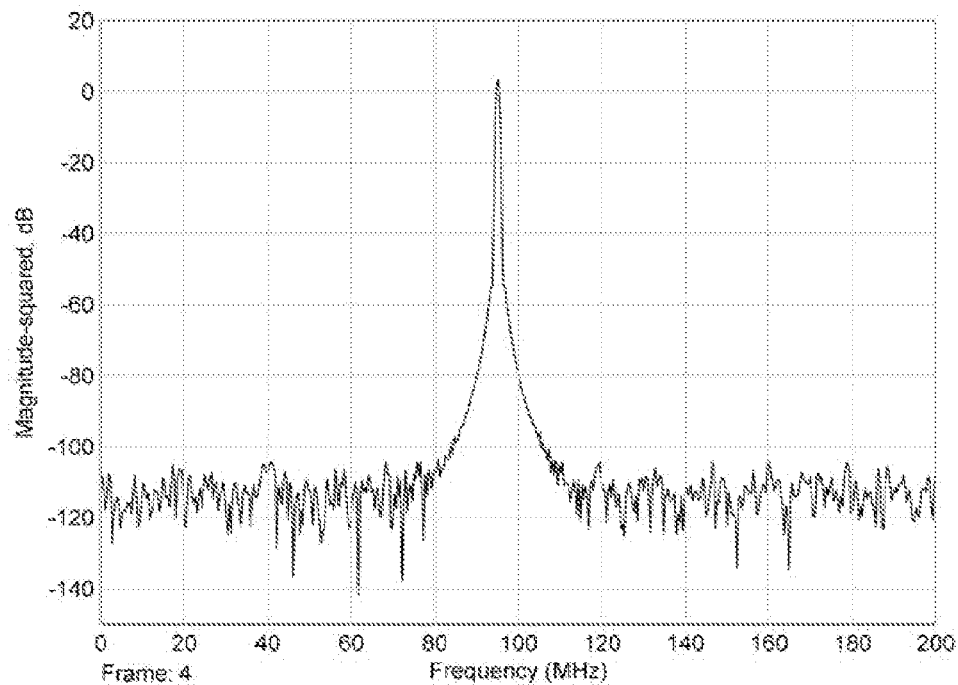

FIG. 9A shows a graph of the performance results of a test of a Sigma-Delta ADC using a source frequency of 95 MHz, where the Sigma-Delta ADC includes a Discrete Time Filter (DTF) in the feed-forward path of the Sigma-Delta loop of the Sigma-Delta ADC. FIG. 9B shows a graph of the performance results of a test of the Sigma-Delta ADC using a source frequency of 95 MHz, where the Sigma-Delta ADC has the ADC noise reduction block of FIG. 8. Comparison of FIGS. 9A and 9B shows a 21.7 dB SNR improvement with the Sigma-Delta ADC having the ADC noise reduction block of FIG. 8 over the reference spectrum of FIG. 9A.

Figure 10:
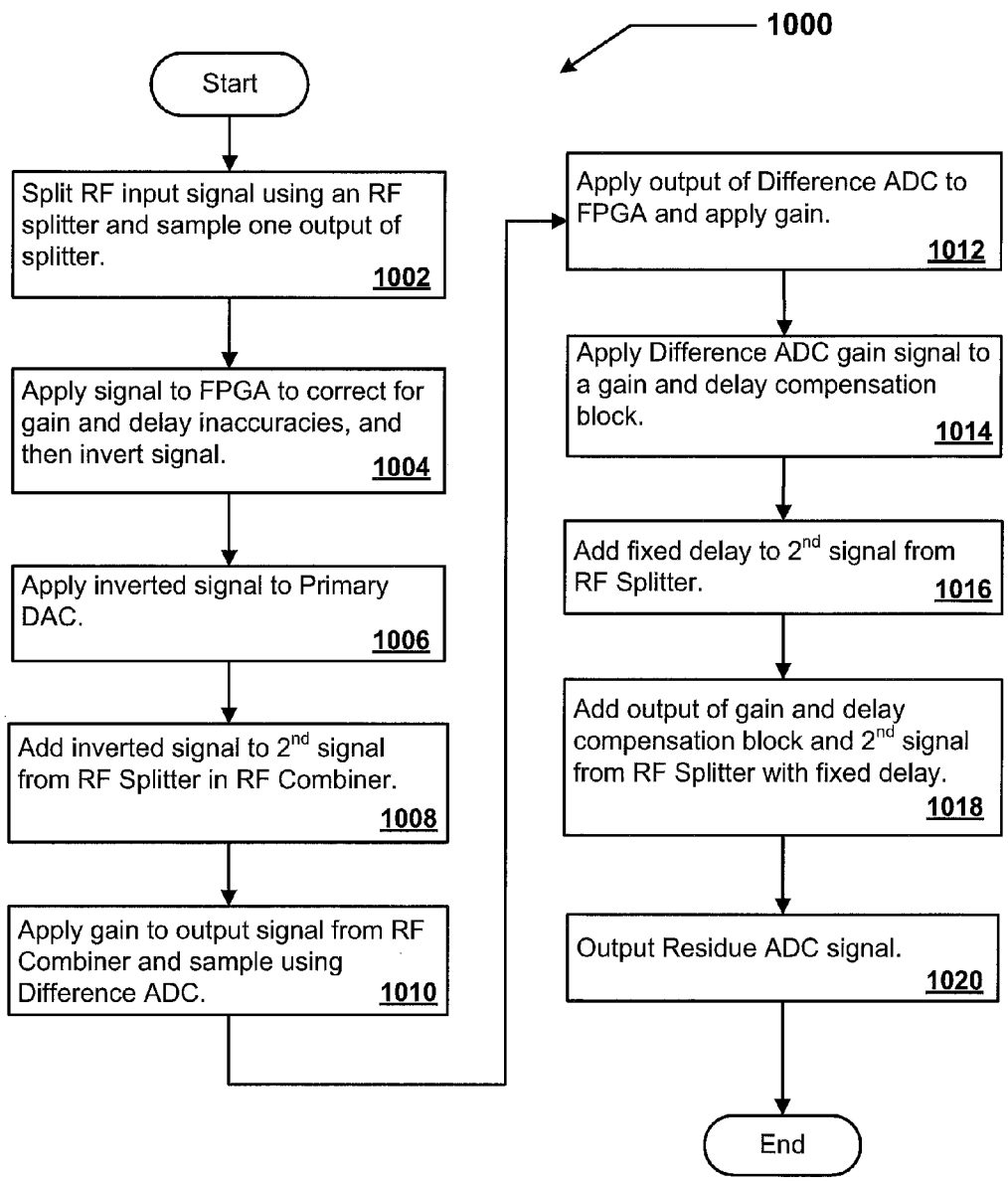
FIG. 10 shows a flow chart illustrating example steps of a method of signal processing performed by the ADC noise reduction block of FIG. 8.

FIG. 10 is a flow chart illustrating example steps of a method of signal processing performed by the ADC noise reduction block of FIG. 8. In step 1002, an RF input signal is split in RF Splitter block 802, and then one output of the splitter is sampled using, as an example, a 14 bit 400 Msps Primary ADC 804. In step 1004, the Primary ADC output signal is applied to FPGA 808, which then corrects for the Gain and Delay inaccuracies of the Fixed RF Delay block 806 and the Residue DAC, using the Gain and Delay Compensation block 810. The signal is then inverted in Inverter 812.

In step 1006, the inverted signal from Inverter 812 is then applied to the 16 bit 400 Msps Primary DAC 814, which then generates an inverted version of the RF input signal, which now has both the RF signal as well as the Primary ADC non-ideal quantization noise added to it. The output of Primary DAC 814 is then added to the $2^{nd}$ RF Splitter block output in the RF Combiner block 816 in step 1006, which then ideally produces the Difference (Residue) Error Term, an output which is the inversion of the ADC quantization noise summed with the Primary DAC noise. In step 1010, a gain of approximately 40 dB or greater is then applied to the RF Combiner block output signal at the Difference ADC Input Gain block 818, and this signal is then sampled using the 14 bit 400 Msps Difference ADC 820, which may be the same device type as is used for Primary ADC 804.

In step 1012, the output of the Difference ADC 820 is then applied to the FPGA 808, where the gain of the signal is reduced by 1/40 at the Difference ADC Output Gain block 822. In step 1014, the Difference ADC Output Gain block signal is then applied to a Gain and Delay Compensation block 824. In step 1016, the output of the Gain and Delay Compensation block 824 is then added to the Primary ADC block 804 output signal in Adder 828 (with a previously-added fixed delay applied to the Primary ADC block 804 output signal in step 1014). The output of Adder 828 then contains the original RF input signal sampled by the Primary ADC 804, with its quantization noise primarily removed, but with the Primary DAC noise added, and is output as a Residue ADC Output signal in step 1020.

It is to be understood that in the above description of example implementations, the partitioning of the system into functional blocks or units as shown in the drawings is not to be construed as indicating that these units necessarily are implemented as physically separate units. Rather, functional blocks or units shown or described may be implemented as separate units, circuits, chips or circuit elements, and one or more functional blocks or units may also be implemented in a common circuit, chip, circuit element or unit.

It will be understood, and is appreciated by persons skilled in the art, that one or more processes, sub-processes, or process steps described in connection with FIG. 10 may be performed by hardware and/or software. If the process is performed by software, the software may reside in software memory (not shown) in a suitable electronic processing component or system such as one or more of the functional components or modules schematically depicted in FIG. 8. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" is any means that may contain, store or communicate the program for use by or in connection with the instruction execution system, apparatus, or device. The computer readable medium may selectively be, for example, but is not limited to, an electronic, magnetic, optical, electromagnetic, infrared, or semiconductor system, apparatus or device. More specific examples, but nonetheless a non-exhaustive list, of computer-readable media would include the following: a portable computer diskette (magnetic), a RAM (electronic), a read-only memory (ROM) (electronic), an erasable programmable read-only memory (EPROM or Flash memory) (electronic) and a portable compact disc read-only memory (CDROM) (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. An analog-to-digital converter (ADC) noise reduction block comprising:
   a radio frequency (RF) splitter;
   a primary ADC coupled to a first output of the RF splitter;
   a fixed RF delay block coupled to a second output of the RF splitter;
   a field programmable gate array (FPGA) coupled to an output of the primary ADC;
   a primary digital-to-analog converter (DAC) coupled to an output of the FPGA;
   an RF combiner coupled to an output of the fixed RF delay block and to an output of the primary DAC;
   a difference ADC coupled to an output of the RF combiner; and
   an adder coupled to an output of the difference ADC and to an output of the primary ADC.

2. The ADC noise reduction block of claim 1, wherein the FPGA further includes:
   a gain and delay compensation block; and
   an inverter coupled to an output of the gain and delay compensation block.

3. The ADC noise reduction block of claim 2, wherein the FPGA further includes a fixed delay block whose output is coupled to an input of the inverter.

4. The ADC noise reduction block of claim 3, wherein the FPGA further includes:
   a difference ADC output gain block; and
   a gain and delay compensation block coupled to an output of difference ADC output gain block and whose output is coupled to an input of the adder.

5. A method of reducing noise in an analog-to-digital converter (ADC), the method comprising:
   splitting an incoming radio frequency (RF) signal into a first input signal and a second input signal;
   applying the first input signal to a primary ADC;
   correcting an output signal of the primary ADC for gain and delay inaccuracies;
   inverting the corrected signal;
   applying the inverted corrected signal to a primary digital-to-analog converter (DAC);
   combining an output of the primary DAC with the second input signal in an RF combiner; and
   applying a combined output signal of the RF combiner to a difference ADC.

* * * * *